US009053784B2

(12) United States Patent
Tiburzi et al.

(10) Patent No.: US 9,053,784 B2
(45) Date of Patent: Jun. 9, 2015

(54) APPARATUSES AND METHODS FOR PROVIDING SET AND RESET VOLTAGES AT THE SAME TIME (75) Inventors: Marco-Domenico Tiburzi, Avezzano (IT); Giulio-Giuseppe Marotta, Contigliano (IT)

(73) Assignee: Micron Technology, Inc., Boise, ID (US)

(*) Notice: Subject to any disclaimer, the term of this patent is extended or adjusted under 35 U.S.C. 154(b) by 479 days.

(21) Appl. No.: 13/445,577

(22) Filed: Apr. 12, 2012

(65) Prior Publication Data
US 2013/0272053 A1 Oct. 17, 2013

(51) Int. Cl.
*G11C 11/00* (2006.01)
*G11C 13/00* (2006.01)

(52) U.S. Cl.
CPC ........ *G11C 13/0007* (2013.01); *G11C 13/0038* (2013.01); *G11C 13/004* (2013.01); *G11C 13/0061* (2013.01); *G11C 13/0069* (2013.01); *G11C 13/0097* (2013.01); *G11C 2213/79* (2013.01); *G11C 2013/0083* (2013.01)

(58) Field of Classification Search
CPC ........... G11C 13/0069; G11C 13/0002; G11C 13/0028
USPC ................................ 365/148, 185.23, 210.12
See application file for complete search history.

(56) References Cited

U.S. PATENT DOCUMENTS

| 7,433,222 | B2 | 10/2008 | Hosoi et al. | |
|---|---|---|---|---|
| 7,952,909 | B2 * | 5/2011 | Inoue et al. | 365/148 |
| 8,587,986 | B2 * | 11/2013 | Kitagawa et al. | 365/148 |
| 2008/0259678 | A1 | 10/2008 | Muraoka et al. | |
| 2009/0039332 | A1 | 2/2009 | Lee et al. | |
| 2010/0080037 | A1 * | 4/2010 | Inoue et al. | 365/148 |
| 2010/0103724 | A1 | 4/2010 | Kim et al. | |
| 2010/0265757 | A1 | 10/2010 | Otsuka | |
| 2010/0296330 | A1 | 11/2010 | Kotaki et al. | |
| 2010/0321978 | A1 | 12/2010 | Inoue | |
| 2011/0051492 | A1 * | 3/2011 | Toda | 365/148 |
| 2011/0103142 | A1 * | 5/2011 | Hanzawa et al. | 365/163 |
| 2011/0147464 | A1 | 6/2011 | Kang | |
| 2011/0216577 | A1 | 9/2011 | Tomotani et al. | |
| 2011/0292715 | A1 | 12/2011 | Ishihara et al. | |
| 2012/0020141 | A1 * | 1/2012 | Kitagawa et al. | 365/148 |
| 2014/0063904 | A1 * | 3/2014 | Yon | 365/148 |

FOREIGN PATENT DOCUMENTS

TW 201403604 A 1/2014
WO WO-2013155326 A1 10/2013

OTHER PUBLICATIONS

"International Application Serial No. PCT/US2013/036209, International Preliminary Report on Patentability mailed Oct. 23, 2014", 10 pgs.

(Continued)

*Primary Examiner* — Tuan T Nguyen
(74) *Attorney, Agent, or Firm* — Schwegman Lundberg & Woessner, P.A.

(57) ABSTRACT

Apparatuses and methods are described, such as those involving driver circuits that are configured to provide reset and set voltages to different variable state material memory cells in an array at the same time. Additional apparatuses, and methods are described.

33 Claims, 5 Drawing Sheets

(56) References Cited

OTHER PUBLICATIONS

"International Application Serial No. PCT/US2013/036209, International Search Report mailed Jul. 26, 2013", 3 pgs.

"International Application Serial No. PCT/US2013/036209, Written Opinion mailed Jul. 26, 2013", 8 pgs.

* cited by examiner

|  | read | set | reset |
|---|---|---|---|
| sdl | Vread | Vinhibit + DV | Vinhibit − DV |
| udl | standby | Vinhibit | Vinhibit |
| swl | HV | HV | HV |
| uwl | GND | GND | GND |

APPARATUSES AND METHODS FOR PROVIDING SET AND RESET VOLTAGES AT THE SAME TIME

BACKGROUND

Some semiconductor devices include variable state materials. For example, memory cells such as resistive random access memory (RRAM) cells include a variable state material whose state can be changed from a high resistance state to a low resistance state and back again. Variable state materials are often non-volatile and can be configured in memory cells having a small form factor. However, in some configurations, variable state materials can exhibit longer program times than other storage technologies such as flash memory. Semiconductor device designs that provide improvements in performance, such as speed and reliability, are desired.

DETAILED DESCRIPTION

In the following detailed description of various embodiments of the invention, reference is made to the accompanying drawings that form a part hereof and in which are shown, by way of illustration, specific embodiments in which the invention may be practiced. These embodiments are described in sufficient detail to enable those skilled in the art to practice the invention. Other embodiments may be utilized and structural, logical, and electrical changes may be made.

Figure 1:
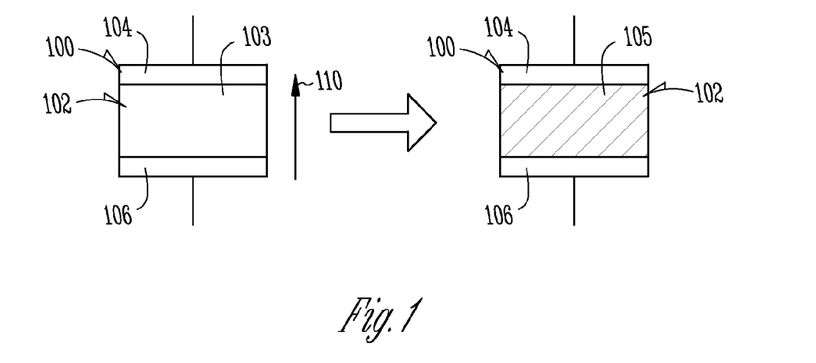
FIG. 1 shows a block diagram setting a first state of a memory cell component according to an embodiment of the invention.

FIG. 1 shows an example component 100 of a memory cell according to an embodiment of the invention. A variable state material 102 is shown located between a first electrode 104 and a second electrode 106. Although only the variable state material 102 is shown, in selected examples, other structures such as intervening material layers may be included along with the variable state material located between the first and second electrodes 104, 106. In one example, the variable state material 102 is a resistance switching material. Other examples of variable state materials 102 may include magnetic switching materials, or other switching materials having a detectable electronic state.

In one example, when a voltage is applied in a direction 110 across the variable state material 102, the state of the variable state material 102 is changed from a high resistance state 103 to a low resistance state 105. In an array of memory cells including a component such as component 100, the high resistance state may represent a digital bit of data, such as a logic 1 or a logic 0 value. Selection circuitry, such as row and column selection circuitry, may be used to select a desired memory cell (including a variable state material 102) from an array of cells, to query and/or alter the resistance state, thus providing data recall and storage capability.

A number of mechanisms can be used to change the physical state (and therefore, the resistance) of the variable state material 102. In one example, the variable state material 102 is changed from a substantially amorphous state to a substantially crystalline state. In another example, upon application of the voltage, one or more conductive filaments are formed within the variable state material 102 that bridge the distance between the first electrode 104 and the second electrode 106. In various mechanisms, the state change is reversible.

Figure 2:
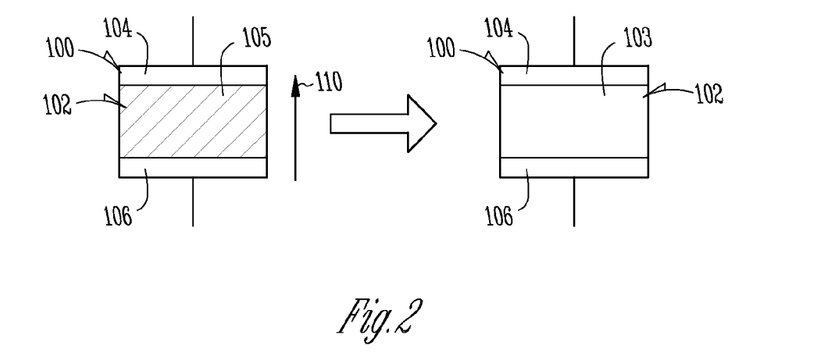
FIG. 2 shows a block diagram setting a second state of the memory cell component from FIG. 1, according to an embodiment of the invention.

FIG. 2 shows the example component 100 from FIG. 1, in the low resistance state 105. By application of a second voltage 112 in an opposite direction from that shown in FIG. 1, the variable state material 102 is reversed from the low resistance state 105 back to the high resistance state 103. In this way, the physical state (and thus the resistance) of the variable state material 102 can be changed as desired to occupy a selected one of at least two possible states.

Figure 3:
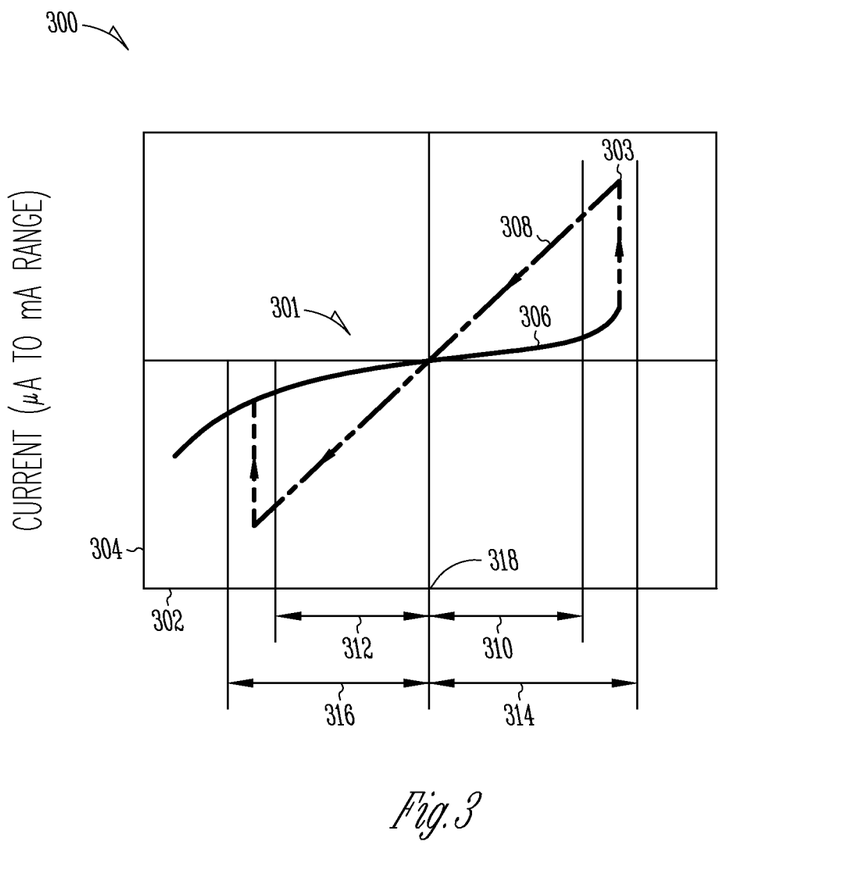
FIG. 3 shows a voltage-current diagram of a variable resistive material according to an embodiment of the invention.

FIG. 3 shows an example voltage/current diagram 300 of a bipolar variable state material. The diagram shows voltage on the X-axis 302 and current on the Y-axis 304. In operation, a variable state material exhibits high resistance behavior along a high resistance portion 306 of the illustrated curve 301. If an applied voltage is within a first voltage range 310, or a second voltage range 312 with respect to a reference voltage level 318, the variable state material remains within the high resistance portion 306 of the curve 301. If an applied voltage is greater than or equal to a third voltage 314 (which is in turn greater than the upper limit of the voltage range 310) with respect to the reference voltage level 318, the variable state material exhibits low resistance, as illustrated by point 303 on the curve 301 and moves to a low resistance portion 308 of the curve 301. The variable state material will remain in the low resistance portion 308 of the curve 301 until an applied voltage magnitude is greater than or equal to a fourth voltage 316 (which is in turn greater than the magnitude of the voltage range 312) with respect to the reference voltage level 318. Then the variable state material will again returns to the high resistance portion 306 of the curve 301.

Although FIG. 3 illustrates a bipolar variable state material behavior, some devices described herein may use a unipolar variable state material. In a unipolar variable state material, the state may be changed by application of different magnitudes of applied voltage in the same direction. In one bipolar example, the reference voltage 318 is approximately zero volts, with the third voltage 314 and fourth voltage 316 being substantially equal in magnitude, and opposite in polarity. For example the third voltage 314 may be approximately 1 volt, and the fourth voltage 316 may be approximately −1 volt.

In a positive only voltage range example, the reference voltage 318 may be approximately 3 volts, with the third voltage 314 and fourth voltage 316 of the same magnitude, as defined by a voltage offset. For example the third voltage 314 may be approximately 4 volts (reference voltage 318 plus a voltage offset of about 1 volt), and the fourth voltage 316 may be approximately 2 volts (reference voltage 318 minus a voltage offset of about 1 volt).

Variable state materials may be formed into relatively small, non-volatile memory cells. In one example, a one transistor, one resistor (1T1R) configuration is possible, in contrast to transistor-based static random access memory (SRAM) cells that use six transistors.

Figure 4:
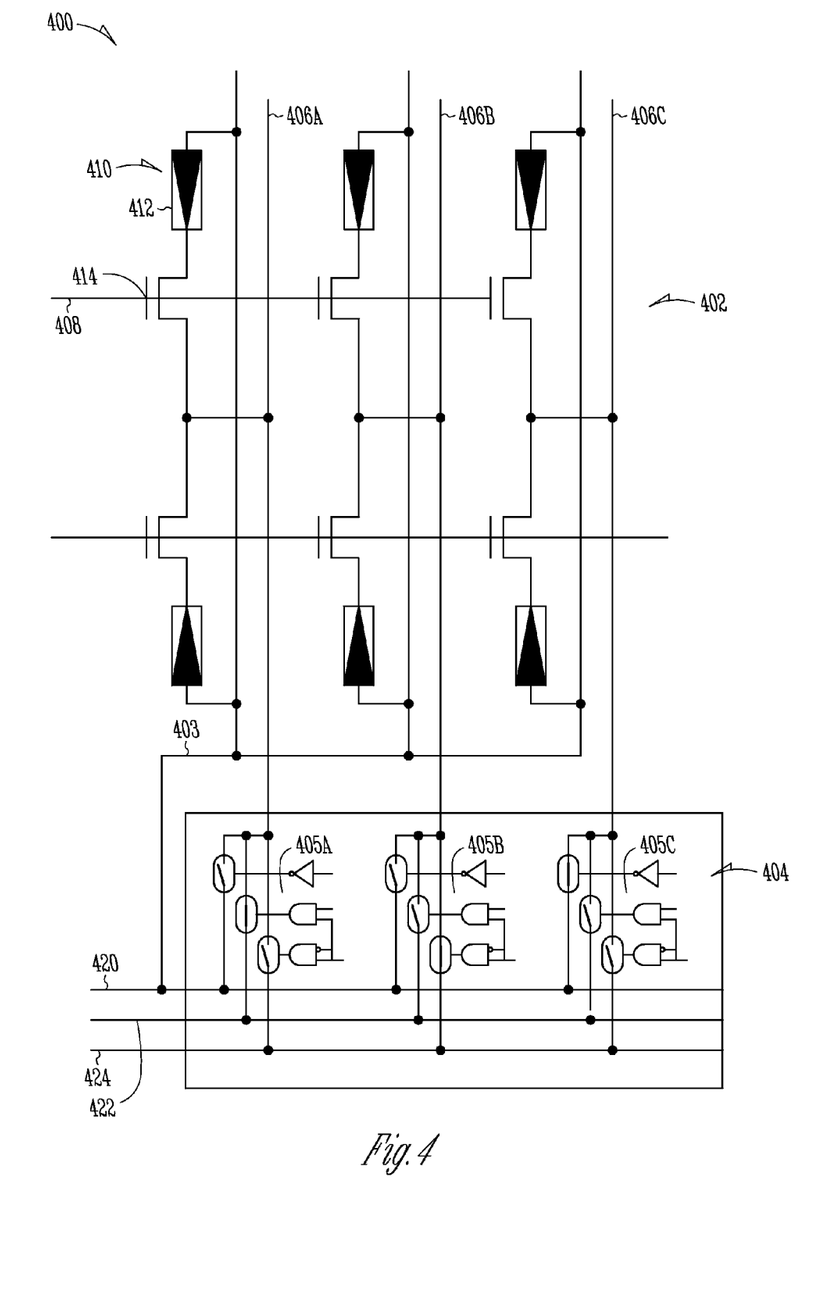
FIG. 4 shows a circuit diagram of a memory device according to an embodiment of the invention.

FIG. 4 shows an example circuit diagram of an apparatus 400 including a variable state material according to an embodiment of the invention. In one example, the apparatus 400 comprises a memory device. As used herein, "apparatus" is used broadly to refer to any of a number of different structures, including, but not limited to, systems, devices, circuits, chip assemblies, etc. In the example of FIG. 4, the apparatus 400 includes an array 402 of memory cells 410, and a driver circuit 404. In one example, the driver circuit 404 is configured to provide different voltages to different memory cells 410 in the array 402 at the same time.

At least some of the cells 410 in the array 402 include a variable state material component 412. In one example, the variable state material component 412 includes a variable state material coupled between a first electrode and a second electrode, similar to or identical to the examples described in FIGS. 1 and 2. Memory cells 410 in the array 402 may further include a selector device 414. In selected examples, such as cross point architecture, a selector device may not be included. In one example, the selector device 414 includes an n-type metal oxide (NMOS) transistor. In one example, the selector device 414 includes an p-type metal oxide (PMOS) transistor. Other examples of selector devices 414 may include additional circuitry, diodes, and other electronic devices.

FIG. 4 further shows a number of access lines 408 coupled to selector devices 414 in the array 402. In one example, the number of access lines 408 includes a number of word lines. A source 403, and a number of data lines 406a-406c are shown coupled to the memory cells 410 in the array 402. In one example, the number of data lines 406 includes a number of bit lines. In the example of FIG. 4, the driver circuit 404 is configured as a column driver.

In one example, the driver circuit 404 is configured to provide multiple different voltages to the data lines 406a-406c of different memory cells at the same time. The driver circuit 404 is shown including a first voltage input node 420, a second voltage input node 422, and a third voltage input node 424. Although three different voltage input nodes are shown, other configurations including two voltage input nodes, or more than three voltage input nodes are within the scope of various embodiments.

The driver circuit can also include selection circuitry 404 to selectively couple the voltage input nodes 420, 422 and 424 to different memory cells at the same time. The selection circuitry 404 can include a number of selector circuits 405a-405c that can each select any one of the voltage input nodes 420, 422, 424 and thus apply a selected voltage to one or more selected memory cells 410 in the array 402. In the example shown, the selector circuits 405a-405c are individually selectable to apply different voltages to different memory cells 410 in the array 402. In one example, the different voltages are discrete voltages that are substantially constant over the time that they are applied. In one example, the different voltages on the voltage input nodes 420, 422, 424 may be variable over a selected length of time.

In one example the voltage input nodes 420, 422, 424 are configured as a set voltage node, a reset voltage node, and an inhibit voltage node. Using FIG. 3 as an example, the reference voltage 318 comprise an inhibit voltage. Memory cells 410 in the array 402 that receive the inhibit voltage will not be programmed to a high resistance state, or reversed from a high resistance state to a low resistance state.

A set voltage may include an inhibit voltage plus an offset voltage, such as the third voltage 314. A reset voltage may include an inhibit voltage minus an offset voltage, such as the fourth voltage 316.

For example, a first selector circuit 405a is shown selectively coupling the second voltage input node 422 to data line 406a. In one example the second voltage input node 422 includes a set voltage. In one example, the set voltage is approximately equal to 4 volts.

The second selector circuit 405b is shown selectively coupling the third voltage input node 424 to data line 406b. In one example the third voltage input node 424 includes a reset voltage. In one example, the reset voltage is approximately equal to 2 volts.

The third selector circuit 405c is shown selectively coupling the first voltage input node 420 to data line 406c. In one example the first voltage input node 420 includes an inhibit voltage. In one example, the inhibit voltage is approximately equal to 3 volts.

In operation, each of the selector circuits 405a-405c are individually selectable, and can provide any desired voltage from the voltage input lines 420, 422, 424 to any desired data line 406a-406c at the same time. Performance of the apparatus 400 may be enhanced using the driver circuit 404 shown in FIG. 4. For example, while selected cells in a given column of the array 402 are being set to a low resistance state, other selected cells in a different given column of the array 402 can be reset at the same time. Additionally, at the same time, other cells in the array 402 may have no operation performed on them as a result of an applied inhibit voltage. Data programming operation times may be reduced by a factor of more than two times when compared to devices that are only capable of driving one voltage to the array at a time.

Figure 5:
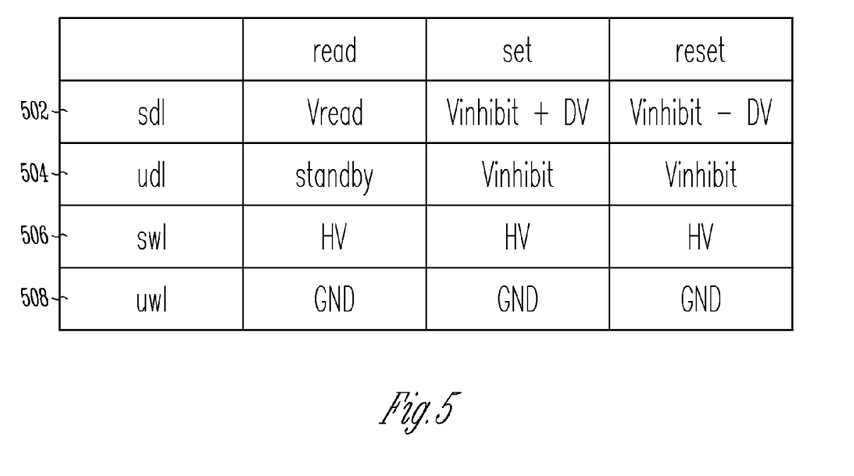
FIG. 5 shows a voltage table according to an embodiment of the invention.

FIG. 5 illustrates an example voltage table showing the operation of a selected data line 502, an unselected data line 504, a selected access line 506, and an unselected access line 508. In one example, a driver circuit 404 from FIG. 4 drives the voltages shown in the table of FIG. 5. In an example read operation, the selected data line 502 is driven to a read voltage. In one example, a read voltage is the same as the first voltage range 310 from FIG. 3. Further in the example read operation, the selected access line 506 is driven to a logical high voltage, and the unselected access line 508 is driven to approximately ground. In one example, the unselected data line 504 is driven to a standby voltage.

In an example set operation, the selected data line 502 is driven to an inhibit voltage plus a voltage offset. In one example, a set voltage is the same as the third voltage 314 from FIG. 3. Further in the example set operation, the selected access line 506 is driven to a logical high voltage, and the unselected access line 508 is driven to approximately ground. In one example, the unselected data line 504 is driven to an inhibit voltage. In one example the inhibit voltage is the same as the reference voltage 318 from FIG. 3.

In an example reset operation, the selected data line 502 is driven to an inhibit voltage minus a voltage offset. In one example, a reset voltage includes the fourth voltage 316 from FIG. 3. Further in the example reset operation, the selected access line 506 is driven to a logical high voltage, and the unselected access line 508 is driven to approximately ground. In one example, the unselected data line 504 is driven to an inhibit voltage. In one example the inhibit voltage includes the reference voltage 318 from FIG. 3.

Figure 6:
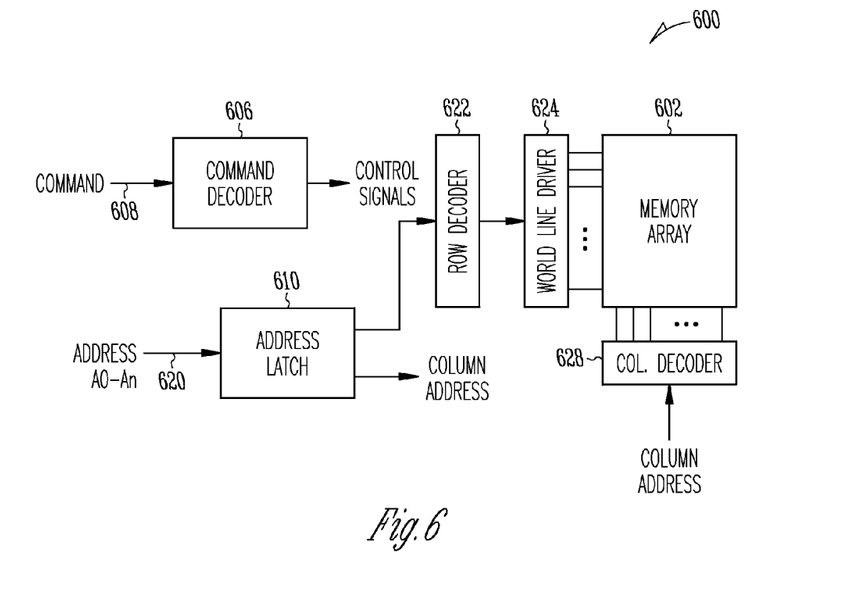
FIG. 6 shows a block diagram of a memory device according to an embodiment of the invention.

FIG. 6 illustrates a portion of an apparatus in the form of a memory system 600 incorporating a driver circuit similar to or identical to the driver circuit 404 from FIG. 4. The memory system 600 includes an array 602 of memory cells, which may comprise, for example, RRAM or other memory cells incorporating a variable state material that operates as described in various embodiments above. The memory system 600 includes a command decoder 606 that receives memory commands through a command bus 608 and generates corresponding control signals within the memory system 600 to carry out various memory operations. Row and column address signals are applied to the memory system 600 through an address bus 620 and provided to an address latch 610. The address latch then outputs a separate column address and a separate row address.

The row and column addresses are provided by the address latch 610 to selection circuitry, such as a row address decoder 622 and a column address decoder 628, respectively. The column address decoder 628 selects data lines extending through the array 602 corresponding to respective column addresses. In one example the column address decoder 628 includes a driver circuit similar to the driver circuit 404 of FIG. 4. The row address decoder 622 is connected to access line driver 624 that activates respective rows of memory cells in the array 602 corresponding to received row addresses. In one example the rows of memory cells in the array 602 correspond to data lines 408 from FIG. 4. The command decoder 606 responds to memory commands applied to the command bus 608 to perform various operations on the memory array 602. In particular, the command decoder 606 is used to generate internal control signals to read data from and write data to the memory array 602.

Figure 7:
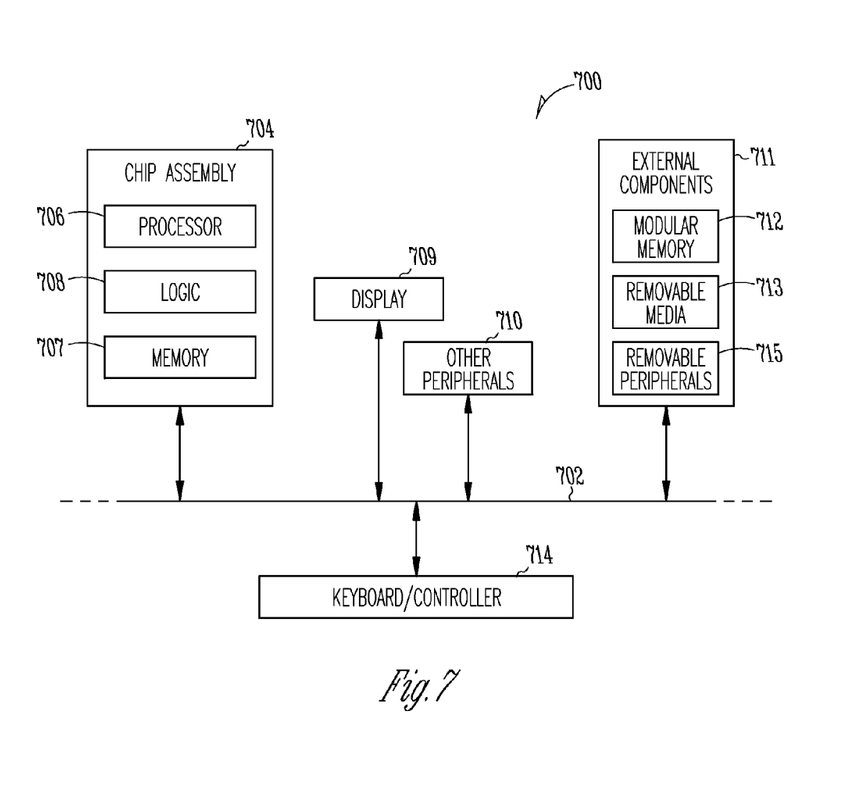
FIG. 7 shows an information handling system, including a memory device, according to an embodiment of the invention.

An embodiment of an apparatus in the form of an information handling system, such as a computer, is included in FIG. 7 to show an embodiment of a high-level device application. FIG. 7 is a block diagram of an information handling system 700 incorporating at least one chip or chip assembly 704 that includes a memory device 707 (e.g., a device similar to or identical to the apparatus 400 shown in FIG. 4 and/or the apparatus 600 shown in FIG. 6) according to an embodiment of the invention. The assembly 704 may also include a processor 706 and other logic 708.

In one example, the memory device 707 includes a variable state material memory device such as an RRAM. The information handling system 700 shown in FIG. 7 is merely one example of a system in which the present invention can be used. Other examples include, but are not limited to, personal data assistants (PDAs), tablet computers, cameras, cellular telephones, MP3 players, aircraft, satellites, military vehicles, etc.

In this example, information handling system 700 comprises a data processing system that includes a system bus 702 to couple the various components of the system. System bus 702 provides communications links among the various components of the information handling system 700 and may be implemented as a single bus, as a combination of busses, or in any other suitable manner.

Chip assembly 704 is coupled to the system bus 702. Chip assembly 704 may include any circuit or operably compatible combination of circuits. In one embodiment, chip assembly 704 includes a processor 706 that can be of any type. As used herein, "processor" means any type of computational circuit such as, but not limited to, a microprocessor, a microcontroller, a graphics processor, a digital signal processor (DSP), or any other type of processor or processing circuit. Multiple processors such as "multi-core" devices are also within the scope of the invention.

In one embodiment, a memory device 707, such as a memory device described in embodiments above, is included in the chip assembly 704. Those skilled in the art will recognize that a wide variety of memory device configurations may be used in the chip assembly 704. As discussed above, in selected embodiments, the memory configuration includes RRAM. In selected embodiments the memory cells are arranged in different logical configurations, such as NAND memory or NOR memory.

In one embodiment, additional logic chips 708 other than processor chips are included in the chip assembly 704. An example of a logic chip 708 other than a processor includes an analog to digital converter. Other circuits on logic chips 708 such as custom circuits, an application-specific integrated circuit (ASIC), etc. are also included in one embodiment of the invention.

Information handling system 700 may also include an external memory 711, which in turn can include one or more memory elements suitable to the particular application, such as one or more hard drives 712, and/or one or more drives that handle removable media 713 such as flash drives, compact disks (CDs), digital video disks (DVDs), and the like.

Information handling system 700 may also include a display device 709 such as a monitor, additional peripheral components 710, such as speakers, etc. and a keyboard and/or controller 714, which can include a mouse, a touchscreen interface, or any other device that permits a system user to input information into and receive information from the information handling system 700.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon studying the above description.

What is claimed is:

1. A memory device, comprising:
   an array of memory cells, each of the cells including a variable state material; and
   a driver coupled to the array of memory cells to provide set and reset voltages to different memory cells in the array at the same time.

2. The memory device of claim 1, wherein the variable state material includes a resistance switching material.

3. The memory device of claim 1, wherein the driver is configured to provide three different voltages to different memory cells in the array at the same time.

4. The memory device of claim 3, wherein the three different voltages include the set voltage, the reset voltage and an inhibit voltage.

5. The memory device of claim 1, wherein the array further includes selector devices to access memory cells.

6. The memory device of claim 5, wherein the selector devices include N channel transistors.

7. The memory device of claim 5, wherein the selector devices include P channel transistors.

8. A driver circuit, comprising:
   a plurality of voltage input nodes, including a reset voltage input node and a set voltage input node;
   selector circuitry to selectively couple the reset voltage input node and the set voltage input node to different memory cells in an array of memory cells at the same time.

9. The driver circuit of claim 8, wherein the selector circuitry is coupled to a number of data lines, wherein the selector circuitry selectively couples the voltage input nodes to the different memory cells in the array via the number of data lines.

10. The driver circuit of claim 8, wherein the plurality of voltage input nodes includes three different voltage input nodes.

11. The driver circuit of claim 10, wherein the three different voltage input nodes includes the set voltage node, the reset voltage node, and an inhibit voltage node.

12. The driver circuit of claim 8, wherein each of the memory cells includes a variable state material.

13. The driver circuit of claim 12, wherein the plurality of voltage input nodes includes a set voltage node approximately equal to 4 volts.

14. The driver circuit of claim 12, wherein the plurality of voltage input nodes includes a reset voltage node approximately equal to 2 volts.

15. The driver circuit of claim 12, wherein the plurality of voltage input nodes includes an inhibit voltage node approximately equal to 3 volts.

16. An apparatus, comprising:
an array of memory cells, each of the cells including a resistance switching material;
a driver circuit coupled to data lines of the array to provide set and reset voltages to selected ones of the memory cells in the array at the same time.

17. The apparatus of claim 16, wherein each of the cells further includes first and second electrodes, wherein the switching material is between the first and second electrodes.

18. The apparatus of claim 16, further including a host processor coupled to the driver circuit.

19. The apparatus of claim 18, wherein the host processor and the array of memory cells are located in a single chip assembly.

20. A method, comprising:
selecting a plurality of resistive random access memory cells;
driving reset and set voltages to different ones of the memory cells in the selected plurality at the same time.

21. The method of claim 20, wherein driving reset and set voltages to different ones of the memory cells in the selected plurality at the same time includes driving reset, set and inhibit voltages to different ones of the memory cells in the selected plurality at the same time.

22. The method of claim 20, wherein driving reset and set voltages to different ones of the memory cells in the selected plurality at the same time comprises driving the reset and set voltages using a driver circuit.

23. The method of claim 22, wherein a column decoder comprises the driver circuit and wherein selecting a plurality of resistive random access memory cells comprises selecting a plurality of resistive random access memory cells using row selection circuitry.

24. The method of claim 20, wherein driving reset and set voltages to different ones of the memory cells in the selected plurality at the same time includes driving substantially discrete reset and set voltages.

25. The method of claim 24, wherein driving substantially discrete reset and set voltages to different ones of the memory cells in the selected plurality at the same time comprises driving substantially discrete inhibit, reset and set voltages to different ones of the memory cells in the selected plurality at the same time.

26. The method of claim 21, wherein the set voltage is substantially equal to the inhibit voltage plus a voltage offset, and wherein the reset voltage is substantially equal to the inhibit voltage minus the voltage offset.

27. The method of claim 26, wherein the inhibit voltage is approximately 3 volts, and the voltage offset is approximately one volt.

28. The method of claim 21, wherein the reset voltage is less than the inhibit voltage, and the inhibit voltage is less than the set voltage.

29. A method, comprising:
coupling a variable state material to a selector device to form a memory cell;
coupling a plurality of memory cells to a plurality of transmission lines;
coupling a driver to the plurality of transmission lines; and
forming circuitry in the driver capable of providing two or more different voltages to different transmission lines at the same time.

30. The method of claim 29, wherein forming circuitry in the driver includes forming circuitry capable of three different voltages of the same polarity, wherein inhibit voltage is less than the set voltage, and the set voltage is less than the reset voltage.

31. The method of claim 29, wherein forming circuitry in the driver includes forming circuitry capable of three different voltages of the same polarity, wherein inhibit voltage is less than the reset voltage, and the reset voltage is less than the set voltage.

32. The method of claim 29, wherein forming circuitry in the driver includes forming circuitry capable of three different voltages of the same polarity, wherein inhibit voltage is greater than the set voltage, and the set voltage is greater than the reset voltage.

33. The method of claim 29, wherein forming circuitry in the driver includes forming circuitry capable of three different voltages of the same polarity, wherein inhibit voltage is greater than the reset voltage, and the reset voltage is greater than the set voltage.

* * * * *